(12) United States Patent
Wang et al.

(10) Patent No.: US 12,310,042 B2
(45) Date of Patent: May 20, 2025

(54) SILICON CARBIDE MOSFET DEVICE AND MANUFACTURING METHOD THEREOF

(71) Applicant: HANGZHOU SILICON-MAGIC SEMICONDUCTOR TECHNOLOGY CO., LTD., Hangzhou (CN)

(72) Inventors: Jiakun Wang, Hangzhou (CN); Hui Chen, Hangzhou (CN)

(73) Assignee: HANGZHOU SILICON-MAGIC SEMICONDUCTOR TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 18/398,686

(22) Filed: Dec. 28, 2023

(65) Prior Publication Data

US 2024/0136421 A1 Apr. 25, 2024
US 2024/0234536 A9 Jul. 11, 2024

Related U.S. Application Data

(62) Division of application No. 17/479,314, filed on Sep. 20, 2021, now Pat. No. 11,894,440.

(30) Foreign Application Priority Data

Sep. 21, 2020 (CN) .......................... 202010996569.3

(51) Int. Cl.
*H01L 29/66* (2006.01)
*H01L 21/04* (2006.01)
(Continued)

(52) U.S. Cl.
CPC ....... *H10D 12/031* (2025.01); *H01L 21/0465* (2013.01); *H01L 21/047* (2013.01);
(Continued)

(58) Field of Classification Search
CPC ........... H01L 29/66068; H01L 21/0465; H01L 21/047; H01L 29/7827; H01L 29/1095; H01L 29/1608; H01L 29/7802; H01L 29/0684; H01L 21/26586; H01L 29/66803; H01L 21/2253; H01L 21/265–266;
(Continued)

(56) References Cited

U.S. PATENT DOCUMENTS

2012/0074472 A1* 3/2012 Sakanishi ......... H01L 29/66727
257/288

* cited by examiner

*Primary Examiner* — Cuong B Nguyen
(74) *Attorney, Agent, or Firm* — IPRTOP LLC

(57) ABSTRACT

Disclosed a silicon carbide MOSFET device and manufacturing method thereof. The method includes: forming a patterned first barrier layer on an upper surface of the substrate; forming a base region of a second doping type extending from the upper surface to an inside of the substrate through oblique implantation in a first ion implantation process by using a first barrier layer as a mask; forming a source region of the first doping type in the substrate; forming a contact region of the second doping type in the substrate; and forming a gate structure, an implantation angle of the first ion implantation process is adjusted so that the base region extends below a part of the first barrier layer. The method of the present disclosure not only reduces one photoetching process and saves cost, but also realizes a short channel and reduces an on-resistance of the device.

5 Claims, 3 Drawing Sheets

(51) Int. Cl.
*H10D 12/01* (2025.01)
*H10D 30/63* (2025.01)
*H10D 62/832* (2025.01)
*H10D 62/17* (2025.01)

(52) U.S. Cl.
CPC ......... *H10D 30/63* (2025.01); *H10D 62/8325* (2025.01); *H10D 62/393* (2025.01)

(58) Field of Classification Search
CPC ........................... H01L 21/3115–31155; H01L 21/3215–32155; H01L 21/425–426; H01L 21/76825; H01L 21/76859; H01L 21/76862; C23C 14/48; H10D 12/031; H10D 30/63; H10D 62/8325; H10D 62/393; H10D 62/364; H10D 62/142; H10D 84/619; H10F 39/811
See application file for complete search history.

SILICON CARBIDE MOSFET DEVICE AND MANUFACTURING METHOD THEREOF

CROSS-REFERENCE TO RELATED APPLICATION

This application is a divisional application to U.S. application Ser. No. 17/479,314 filed on Sep. 20, 2021, and entitled "Silicon Carbide MOSFET Device and Manufacturing Method Thereof", which claims priority to Chinese Patent Application No. 202010996569.3, filed on Sep. 21, 2020, and entitled "Silicon Carbide MOSFET Device and Manufacturing Method Thereof", the content of which are incorporated herein by reference in its entirety.

FIELD OF TECHNOLOGY

The present disclosure relates to the technical field of semiconductor, in particular, to a silicon carbide MOSFET device and manufacturing method thereof.

DESCRIPTION OF THE RELATED ART

In a field of silicon carbide metal-oxide-semiconductor field-effect transistor (SiC MOSFET), in order to reduce a cell size and increase a current density of SiC MOSFET, a channel length should be set as short as possible. Taking into account an influence of lithography accuracy, the channel length less than 0.5 um will generally use a self-aligned process accomplish. Due to a low diffusion coefficient of SiC, a Si standard self-aligned process cannot be used to form the channel. The existing SiC MOSFET channel self-aligned process first uses photolithographic polysilicon as a barrier layer for a P-type base region, the polysilicon is oxidized after forming the P-type base region, a certain thickness of silicon dioxide on a surface and sidewalls of the polysilicon, and then use the silicon dioxide on the sidewalls as a barrier layer to achieve self-aligned implantation of a N+ source region. In addition, when forming a P+ contact region, since an ion implantation dose of the N+ source region is much greater than that of the P+ contact region, a separate mask is required to form a barrier layer of the P+ contact region, which increases a manufacturing cost.

SUMMARY

In order to solve above technical problem, the present disclosure provides a silicon carbide MOSFET device and manufacturing method thereof.

According to a first aspect of the present disclosure, there is provided a manufacturing method of a silicon carbide MOSFET device, comprising: providing a substrate of a first doping type; forming a patterned first barrier layer on an upper surface of the substrate; forming a base region extending from the upper surface to an inside of the substrate through oblique implantation in a first ion implantation process by using a first barrier layer as a mask, the base region is of a second doping type; forming a source region of the first doping type in the substrate; forming a contact region of the second doping type in the substrate; and forming a gate structure, wherein, an implantation angle of the first ion implantation process is adjusted so that the base region extends below a part of the first barrier layer, and the implantation angle of the first ion implantation process is an angle between an implanting direction of the first ion implantation process and the upper surface of the substrate.

Preferably, by rotating the implantation direction of the first ion implantation process, both sides of the base region extend below the part of the first barrier layer.

Preferably, by controlling the implantation angle of the first ion implantation process, a width of the base region extending below the first barrier layer is controlled.

Preferably, the smaller the implantation angle of the first ion implantation process, the greater a width of the base region extending below the first barrier layer.

Preferably, by controlling an implantation energy of the first ion implantation process, a width of the base region extending below the first barrier layer is controlled.

Preferably, the greater an implantation energy of the first ion implantation process, the greater a width of the base region extending below the first barrier layer.

Preferably, the implantation angle of the first ion implantation process is 45°.

Preferably, a step of forming the source region comprises: forming a second barrier layer on the upper surface of the substrate; and forming the source region extending from the upper surface to the inside of the substrate through self-aligned implantation in a second ion implantation process by using the first barrier layer and the second barrier layer as a mask, wherein, the second barrier layer is located between the first barrier layers and is separated from the first barrier layer.

Preferably, a material of the first barrier layer is different from a material of the second barrier layer.

Preferably, further comprises: removing the second barrier layer after forming the source region.

Preferably, a step of forming the contact region comprises: forming a shielding layer on an upper surface and sidewalls of the first barrier layer and the upper surface of the substrate; and forming the contact region extending from the upper surface to the inside of the substrate through self-aligned implantation in a third ion implantation process by using the first barrier layer and the shielding layer as a mask, wherein, the third ion implantation process implants dopants into the substrate through the shielding layer located on the upper surface of the substrate to form the contact region, a stacking part of the first barrier layer and the shielding layer and the shielding layer on a sidewall of the first barrier layer resists the implantation of the third ion implantation process.

Preferably, a thickness of the shielding layer is not more than half of a thickness of the first barrier layer.

Preferably, a thickness of the shielding layer ranges from 800 to 1200 angstroms.

Preferably, a material of the first barrier layer is the same as a material of the shielding layer.

Preferably, further comprises: removing the shielding layer after forming the contact region.

Preferably, a step of forming the contact region comprises: forming the contact region extending from the upper surface to the inside of the substrate through self-aligned implantation in a second ion implantation process by using the first barrier layer as a mask, wherein a width of the contact region is smaller than a width of the base region.

Preferably, a step of forming the source region comprises: at least etching part of a thickness of the first barrier layer in a lateral direction; forming a third barrier layer between the etched first barrier layers; and forming the source region extending from the upper surface to the inside of the substrate through self-aligned implantation in a third ion implantation process by using the etched first barrier layer and the third barrier layer as a mask, wherein, a thickness of the etched first barrier layer is smaller than a width of the base region extending below the first barrier layer.

Preferably, a material of the first barrier layer is different from a material of the third barrier layer.

Preferably, the thickness of the etched first barrier layer ranges from 800 to 1200 angstroms.

Preferably, the first barrier layer is etched by an isotropic etching process.

Preferably, removing the etched first barrier layer and the third barrier layer after forming the source region.

Preferably, a step of forming the gate structure comprises: forming a gate dielectric layer on the upper surface of the substrate; and forming a gate conductor on a part of an upper surface of the gate dielectric layer; wherein, the gate conductor covers at least part of the source region and the base region.

Preferably, further comprises: depositing an interlayer dielectric layer on the gate dielectric layer and the gate conductor, forming an opening exposing an upper surface of the contact region and part of an upper surface of the source region by etching the interlayer dielectric layer and the gate dielectric layer, forming a source metal in the opening, and forming a drain metal on a back surface of the substrate.

Preferably, the one of N-type and P-type, and the second doping type is the other of N-type and P-type.

According to a second aspect of the present disclosure, there is provided a silicon carbide MOSFET device formed according to the above manufacturing method, comprising: a substrate of a first doping type; a base region extending from an upper surface to an inside of the substrate; a contact region of a second doping type and a source region of the first doping type extending from the upper surface to the inside of the substrate and located in the base region; and a gate structure on the upper surface of the substrate, wherein, a junction depth of the contact region and a junction depth of the source region are smaller than a junction depth of the base region, a width of the contact region is smaller than a width of the base region, and the source region is located on and in contact with both sides of the contact region.

According to a third aspect of the present disclosure, there is provided a silicon carbide MOSFET device formed according to the above manufacturing method, comprising: a substrate of a first doping type; a base region extending from an upper surface to an inside of the substrate; a contact region of a second doping type and a source region of the first doping type extending from the upper surface to the inside of the substrate and located in the base region; a gate structure on the upper surface of the substrate, the gate structure covering at least part of the source region and the base region; an interlayer dielectric layer on the gate structure, the interlayer dielectric layer having an opening that exposes the contact region and part of an upper surface of the source region; a source metal contacting with the source region and the contact region through the opening, and a drain metal on a back surface of the substrate, wherein, a junction depth of the contact region and a junction depth of the source region are smaller than a junction depth of the base region, a width of the contact region is smaller than a width of the base region, and the source region is located on and in contact with both sides of the contact region.

According to the manufacturing method of the SiC MOSFET device provided by the present disclosure, forming the base region through oblique implantation by adjusting the implantation angle and energy of the first ion implantation process; then forming the contact region or the source region through self-aligned implantation by use of the first barrier layer that is used when forming the base region as a mask; finally forming the source region or the contact region through self-aligned implantation by use of the mask formed by depositing the shielding layer on the first barrier layer or etching part of the first barrier layer. The manufacturing method of the present disclosure not only reduces one photoetching process and saves cost, but also realizes a short channel and reduces an on-resistance of the device.

BRIEF DESCRIPTION OF THE DRAWINGS

The above and other objectives, features and advantages of the present disclosure will become more apparent from the description of embodiments of the present disclosure below with reference to the accompanying drawings.

DETAILED DESCRIPTION OF THE DISCLOSURE

Figure 1A:
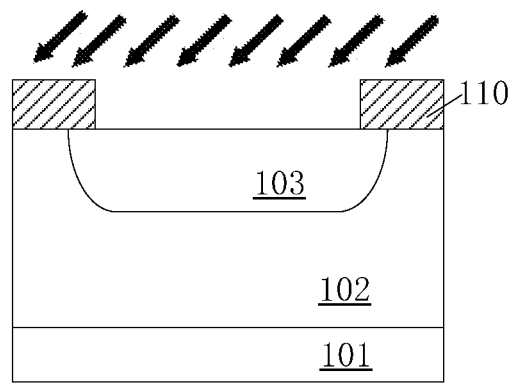
FIGS. 1A-1F show cross sectional structural schematic diagrams of various stages of a manufacturing method of a silicon carbide MOSFET device according to a first embodiment of the present disclosure.

Various embodiments of the present disclosure will be described in more detail below with reference to the accompanying drawings. In the various accompanying drawings, the same elements are denoted by the same or similar reference numerals. For the sake of clarity, the various parts in the accompanying drawings are not drawn to scale. In addition, some well-known parts may not be shown. For simplicity, a semiconductor structure obtained after several steps may be described in one figure.

During description of the structure of a device, when a layer or a region is called "on" or "above" another layer or another region, it may be directly on another layer or another region, or other layers or regions are included between it and another layer or another region. In addition, if the device is turned over, the layer and the region will be located "under" or "below" another layer and another region.

In order to describe the situation of being directly on another layer and another region, the specification uses the expression of "A is directly on B" or "A is on B and adjacent to B". In the present disclosure, "A is directly located in B" means that A is located in B, and A is directly adjacent to B, rather than that A is located in a doped region formed in B.

In this disclosure, the term "wire punching" refers to a phenomenon that after a chip is located on a lead frame and a wire bonding is performed, during a process of injecting an encapsulant, the wires adjacent to each other contact each other due to an impact of the encapsulant, resulting in a short circuit.

In the following, many specific details of the present disclosure are described, such as structure, material, size, processing technology and technology of the device, in order to understand the present disclosure more clearly. However, as those skilled in the art could understand, the present disclosure may not be implemented according to these specific details.

The present disclosure provides a manufacturing method of a silicon carbide MOSFET device, comprising: providing a substrate of a first doping type; forming a patterned first barrier layer on an upper surface of the substrate; forming a base region extending from the upper surface to an inside of the substrate through oblique implantation in a first ion implantation process by using a first barrier layer as a mask, the base region is of a second doping type; forming a source region of the first doping type in the substrate; forming a contact region of the second doping type in the substrate; and forming a gate structure, wherein, an implantation angle of the first ion implantation process is adjusted so that the base region extends below a part of the first barrier layer, and the implantation angle of the first ion implantation process is an angle between an implanting direction of the first ion implantation process and the upper surface of the substrate.

FIG. 1A-1F show sectional structural schematic diagrams of various stages of the manufacturing method of the silicon carbide MOSFET device according to the first embodiment of the present disclosure.

As shown in FIG. 1A, providing the substrate of the first doping type, forming the first barrier layer on the upper surface of the substrate, and etching the first barrier layer to form the patterned first barrier layer. Wherein, the first barrier layer is formed by a deposition process. In this embodiment, the substrate includes a semiconductor substrate 101 of the first doping type and an epitaxial layer 102 of the first doping type located on the semiconductor substrate. That is, the first barrier layer 110 is formed on an upper surface of the epitaxial layer 102. A bottom surface of the epitaxial layer 102 is in contact with the semiconductor substrate 101, and the upper surface of the epitaxial layer 102 is opposite to the bottom surface.

The base region 103 extending from an upper surface to an inside of the epitaxial layer 102 is formed through oblique implantation in the first ion implantation process by using the first barrier layer 110 as the mask, the base region 103 is of the second doping type. By adjusting the implantation angle of the first ion implantation process, the base region 103 extends below a part of the first barrier layer 110, that is, a width of the base region 103 is greater than a width of an implantation window of the first barrier layer. Wherein, the implantation angle of the first ion implantation process is the angle between the implanting direction of the first ion implantation process and the upper surface of the substrate, and the implantation angle is less than 90°. Further, by rotating the implantation direction of the first ion implantation process, both sides of the base region 103 extend below the part of the first barrier layer 110. Further, by rotating the implantation direction of the first ion implantation process, each sides (front, rear, left, and right directions) of the base region 103 extend below the part of the first barrier layer 110. By controlling the implantation angle of the first ion implantation process, the width of the base region 103 extending below the first barrier layer 110 is controlled. When an implantation energy is unchanging, the smaller the implantation angle of the first ion implantation process, the greater the width of the base region 103 extending below the first barrier layer. By controlling the implantation energy of the first ion implantation process, the width of the base region 103 extending below the first barrier layer is controlled. When the implantation angle is unchanging, the greater the implantation energy of the first ion implantation process, the greater the width of the base region 103 extending below the first barrier layer. Preferably, the implantation angle of the first ion implantation process is 45°. In this embodiment, under a condition of the same implantation angle and implantation energy, by rotating the implantation direction, the widths of the two sides of the base region 103 extending below the first barrier layer 110 are the same.

In this embodiment, the first barrier layer is preferably polysilicon, of course, the first barrier layer may also be selected as silicon oxide, silicon nitride or other materials that can be used as a barrier layer, which is not limited herein.

Figure 1B:
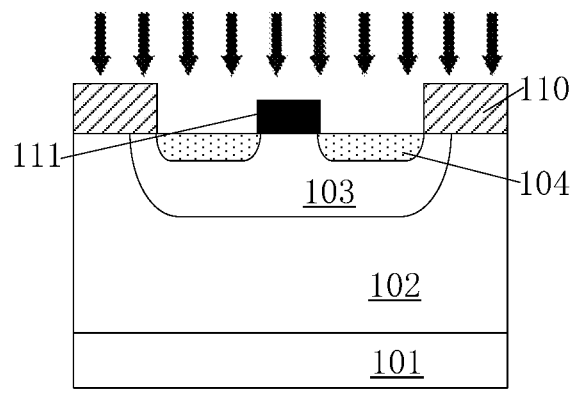

As shown in FIG. 1B, forming the source region 104 of the first doping type in the epitaxial layer 102. Specifically, forming a patterned second barrier layer 111 on the upper surface of the epitaxial layer 102, the second barrier layer 111 located between the first barrier layers 111 and is separated from the first barrier layer 110. The source region extending from the upper surface to the inside of the epitaxial layer 102 is formed through self-aligned implantation in a second ion implantation process by using the first barrier layer and the second barrier layer as a mask. In this embodiment, two source regions 104 are formed, and a junction depth of the source region 104 is smaller than a junction depth of the base region 103. Since the base region 103 is formed by oblique implantation, and the source region 104 is formed by self-aligned implantation, the source region 104 is close to an edge of the first barrier layer 110 and is not in contact with an edge of the base region 103. Thus, without considering the source region diffusion, a part of the base region extending below the first barrier layer is a channel region of the MOSFET, and the width of the base region extending below the first barrier layer is a channel length of the MOSFET. Wherein, in the present disclosure, an angle between the implantation angle of the self-aligned implantation and the upper surface of the substrate is 90°.

A step of forming the patterned second barrier layer 111 includes: forming a deposition layer on the upper surface of the epitaxial layer 102 and the upper surface of the first barrier layer 110, and then selectively etching the deposition layer to remove the deposited layer on the upper surface of the first barrier layer 110 and a part of the upper surface of the epitaxial layer, so that a patterned second barrier layer 111 is formed. A material of the second barrier layer 111 is different from a material of the first barrier layer 110. Preferably, the second barrier layer 111 may be silicon nitride.

Removing the second barrier layer 111 after forming the source region 104.

Figure 1C:
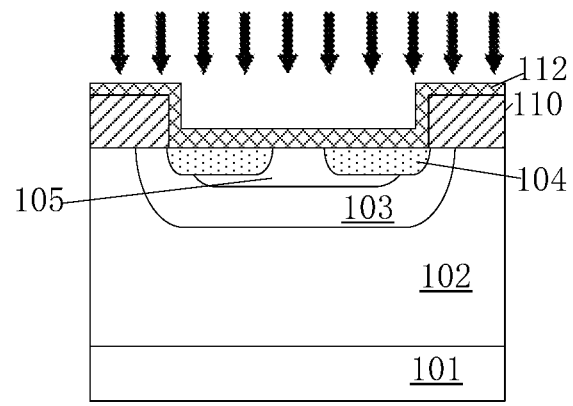

As shown in FIG. 1C, forming the contact region 105 of the second doping type in the epitaxial layer 102. Specifically, forming a shielding layer 112 on the upper surface and sidewalls of the first barrier layer 110 and the upper surface of the epitaxial layer 102; and forming the contact region 105 extending from the upper surface to the inside of the epitaxial layer 102 through self-aligned implantation in a third ion implantation process by using the first barrier layer 110 and the shielding layer 112 as a mask. A thickness of the shielding layer 112 is configured to allow a dopant in the third ion implantation process to be implanted into the epitaxial layer 102 through the shielding layer 112. In addition, a thickness of a stacking portion of the first barrier layer and the shielding layer and the thickness of the shielding layer on the sidewall of the first barrier layer are relatively thick, so that resists the dopant cannot pass through and cannot implanted into the epitaxial layer 102. Thus, due to resisting of the shielding layer 112 on the sidewall of the first barrier layer 110, there is a certain distance between the edge of the contact region 105 and an edge of the channel region (the edge of the source region is close to the first barrier layer 110), so that it can be ensured that the contact region 105 will not diffuse to the channel region of the MOSFET.

Wherein, a doping concentration of the contact region 105 is less than a doping concentration of the source region 104 to ensure that the source region 104 is heavily doped, and the doping concentration of the contact region 105 is greater than a doping concentration of the base region 103 concentration. The source region 104 is located on and in contact with both sides of the contact region 105. Further, the contact region 105 partially overlaps the two source regions 104. A junction depth of the contact region 105 is less than a junction depth of the base region 103, and the junction depth of the contact region 105 is not less than a junction depth of the source region 104.

In this embodiment, the thickness of the shielding layer is configured to ensure that the dopant can pass through the shielding layer during the third ion implantation process, but cannot pass through the stacking portion of the first barrier layer and the shielding layer and the shielding layer on the sidewall of the first barrier layer. Preferably, the thickness of the shielding layer is not more than half of a thickness of the first barrier layer, and the thickness of the shielding layer may be set to 800-1200 angstroms. Preferably, the thickness of the shielding layer is set to 1000 angstroms. Of course, the thickness of the shielding layer is not limited, and those skilled in the art can set it according to specific conditions. The thickness of the first barrier layer can be set to 2000-12000 angstroms, preferably 2000-5000 angstroms. Of course, the thickness of the first barrier layer is not limited to this, and can be set according to specific conditions.

A material of the first barrier layer is preferably the same as a material of the shielding layer, for example, is polysilicon. Of course, those skilled in the art can also choose other materials, which are not limited here.

After the contact region 105 is formed, the first barrier layer 110 and the shielding layer 112 are removed. Since the material of the first barrier layer 110 is the same as the material of the shielding layer 112, they can be removed at one time.

After the source region 104, the base region 103, and the contact region 105 are formed, a high temperature annealing process is performed to activate impurity atoms of the ion implanted dopant.

Figure 1D:
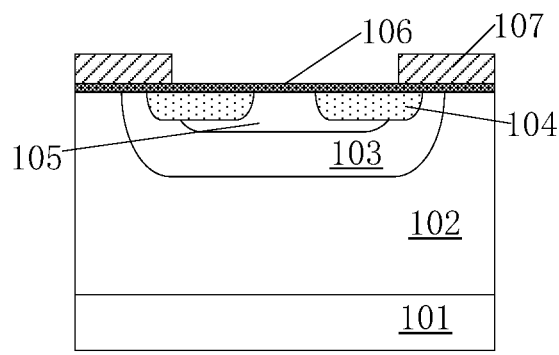

As shown in FIG. 1D, forming a gate dielectric layer 106 on the upper surface of the epitaxial layer 102, and forming a patterned gate conductor 107 on the gate dielectric layer 106. Wherein, the gate conductor is located on an edge area of the epitaxial layer 102, and covers at least part of the source region 104 and the base region 103.

Figure 1E:
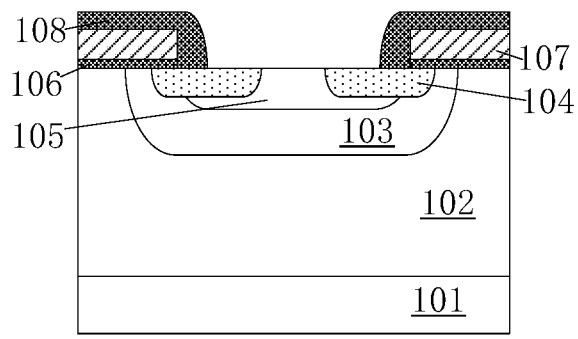

As shown in FIG. 1E, forming an interlayer dielectric layer on the gate dielectric layer 106 and the gate conductor 107, then forming an opening to expose a first surface of the epitaxial layer by etching the interlayer dielectric layer and the gate dielectric layer 106, that is, to expose an upper surface of the contact region 105 and part of an upper surface of the source region 104. The interlayer dielectric layer 108 remains on sidewalls of the gate conductor 107 and an upper surface of the gate conductor 107.

Figure 1F:
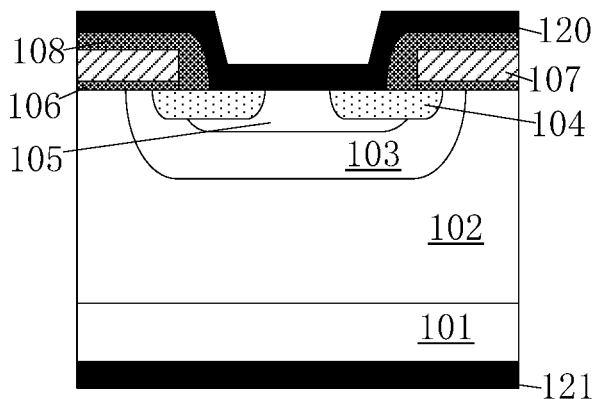

As shown in FIG. 1F, depositing metal in the opening and on the interlayer dielectric layer 108 to form a source electrode 120, and depositing metal on a back surface of the substrate to form a drain electrode 121.

According to the manufacturing method of the SiC MOSFET device provided by the first embodiment of the present disclosure, forming the base region through oblique implantation by adjusting the implantation angle and energy of the first ion implantation process; then forming the source region through self-aligned implantation by use of the first barrier layer that is used when forming the base region as a mask; finally forming the contact region through self-aligned implantation by use of the shielding layer depositing on the first barrier layer when forming the base region, so that the contact region is far away from the edge of the channel region, ensuring that the contact region does not diffuse to the channel region, and the doping concentration of the contact region is controlled to be lower than that of the source region to ensure that the source region is still heavily doped. The manufacturing method of the present disclosure not only reduces one photoetching process and saves cost, but also realizes a short channel and reduces an on-resistance of the device.

Figure 2A:
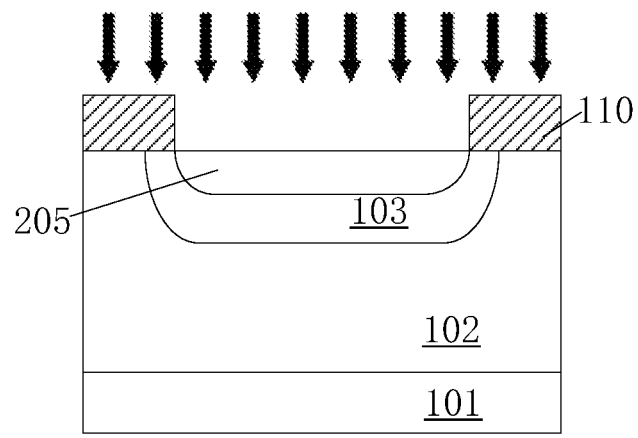
FIGS. 2A-2B show cross sectional structural schematic diagrams of certain stages of a manufacturing method of a silicon carbide MOSFET device according to a second embodiment of the present disclosure.
Figure 2B:
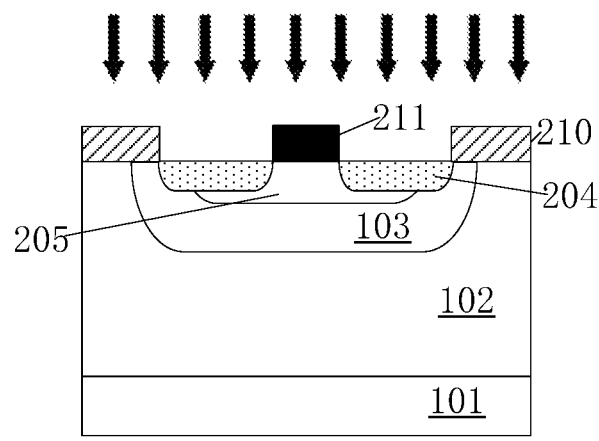

FIG. 2A-2B show sectional structural schematic diagrams of certain stages of the manufacturing method of the silicon carbide MOSFET device according to the second embodiment of the present disclosure.

The manufacturing method of the second embodiment is different from the manufacturing method of the first embodiment in that the method and steps of forming the contact region and the source region are different. The other steps and methods are the same, and won't repeat them here. The specific steps are showing below.

As shown in FIG. 1A, the patterned first barrier layer 110 is formed on the first surface of the substrate, and the base region 103 extending from the upper surface to the inside of the epitaxial layer 102 is formed through oblique implantation by using the first barrier layer 110 as a mask. As shown in FIG. 2A, forming the contact region 205 extending from the upper surface to the inside of the epitaxial layer 102 by using the first barrier layer 110 as a mask, the contact region 205 is of the second doping type. Since the base region 103 is formed by oblique implantation, and the contact region 205 is formed by self-aligned implantation, there is a certain distance between the edge of the contact region 205 and the edge of the base region 103, that is, the width of the contact region 205 is smaller than the width of the base region 103. In addition, the junction depth of the contact region 205 is smaller than the junction depth of the base region 103.

As shown in FIG. 2B, etching part of the first barrier layer, so that part of a thickness of the first barrier layer in a lateral direction is etched to ensure that after the source region is subsequently formed, the contact region 205 is far away from the edge of the channel region of the MOSFET, of course, the thickness of the etched first barrier layer 110 also needs to be smaller than the width of the base region 103 extending below the first barrier layer 110. A thickness of the etched first barrier layer ranges from 800 to 1200 angstroms, preferably 1000 angstroms. In this embodiment, the first barrier layer 110 is preferably etched by an isotropic etching process, so that the first barrier layer 110 is etched in both a vertical direction and the lateral direction.

Then forming a third barrier layer 211 on the upper surface of the epitaxial layer 102, the third barrier layer 211 is located between and is separate from the etched first barrier layers 210. The source region 204 extending from the upper surface to the inside of the epitaxial layer 102 is formed through self-aligned implantation in a third ion implantation process by using the etched first barrier layer 210 and the third barrier layer 211 as a mask. The source region 204 is located on and in contact with both sides of the contact region 205, further, the source region 204 and the contact region 205 partially overlap.

After forming the source region, the etched first barrier layer and the third barrier layer is removed.

According to the manufacturing method of the SiC MOSFET device provided by the second embodiment of the present disclosure, forming the base region through oblique implantation by adjusting the implantation angle and energy of the first ion implantation process; then forming the contact region through self-aligned implantation by use of the first barrier layer that is used when forming the base region as a mask; finally forming the source region through self-aligned implantation by use of the first barrier layer and the third barrier layer when the base region is formed by the etching part, so that the contact region is far away from the edge of the channel region, ensuring that the contact region does not diffuse to the channel region, and the doping concentration of the contact region is controlled to be lower than that of the source region to ensure that the source region is still heavily doped. The manufacturing method of the present disclosure not only reduces one photoetching process and saves cost, but also realizes a short channel and reduces an on-resistance of the device.

The present disclosure further discloses the silicon carbide MOSFET device formed according to the manufacturing method of the first embodiment and the second embodiment, as shown in FIG. 1F. The silicon carbide MOSFET device includes the substrate, and the base region 103, the contact region 105 and the source region 104 located in the substrate. Wherein, the substrate includes the semiconductor substrate 101 and the epitaxial layer 102 located on the semiconductor substrate 101, the contact region 105 and the source region 104 are located in the base region 103, the source region 104 includes two separate parts, and the source region 104 is located on and is in contact with both sides of the contact region 105. Further, the source region 204 and the contact region 205 partially overlap. The junction depth of the contact region 105 is less than the junction depth of the base region 103, and the junction depth of the contact region 105 is not less than the junction depth of the source region 104. The doping concentration of the contact region 105 is less than the doping concentration of the base region 103, and the doping concentration of the base region 103 is less than the doping concentration of the contact region 105. The substrate 101, the epitaxial layer 102, and the source region 104 are of a first doping type, and the base region 103 and the contact region 105 are of a second doping type.

The silicon carbide MOSFET device further includes the gate structure located on the upper surface of the epitaxial layer 102, and the interlayer dielectric layer 108 located on the sidewall and the upper surface of the gate structure. Wherein, the gate structure includes a gate dielectric layer 106 and a gate conductor 107 on the gate dielectric layer 106. The gate conductor 107 is located at the edge area of the upper surface of the epitaxial layer, and at least partially covers the source region 104 and the base region 103. The silicon carbide MOSFET device further includes a source electrode 120 located on the upper surface of the epitaxial layer 102 and the interlayer dielectric layer 108 and a drain electrode 121 located on the back of the substrate 101, wherein the source electrode 120 is electrically connected to the source region 104 and the contact region 105.

It should be noted that in this disclosure, relational terms such as first and second are only used to distinguish one entity or operation from another entity or operation, and do not necessarily require or imply any such actual relationship or order between these entities or operations. Moreover, the terms "include", "include" or any other variants thereof are intended to cover non-exclusive inclusion, so that a process, method, article or equipment that includes a series of elements not only includes those elements, further includes other elements that are not explicitly listed, or further includes elements inherent to such a process, method, article, or equipment. If there are no more restrictions, the element defined by the sentence "including a . . . " does not exclude the existence of other identical elements in the process, method, article, or equipment that includes the element.

According to the embodiments of the present disclosure described above, these embodiments do not describe all the details in detail, nor do they limit the present disclosure to only the specific embodiments described. Obviously, according to the above description, many modifications and changes can be made. This specification selects and specifically describes these embodiments in order to better explain the principles and practical applications of the present disclosure, so that those skilled in the art can make good use of the present disclosure and make modifications based on the present disclosure. The present disclosure is only limited by the claims and their full scope and equivalents.

What is claimed is:

1. A manufacturing method of a silicon carbide MOSFET device, comprising:
   providing a substrate of a first doping type;
   forming a patterned first barrier layer on an upper surface of the substrate;
   forming a base region extending from the upper surface to an inside of the substrate through oblique implantation in a first ion implantation process by using a first barrier layer as a mask, the base region is of a second doping type;
   forming a source region of the first doping type in the substrate;
   forming a contact region of the second doping type in the substrate; and
   forming a gate structure,
   wherein, an implantation angle of the first ion implantation process is adjusted so that the base region extends below a part of the first barrier layer, and the implantation angle of the first ion implantation process is an angle between an implanting direction of the first ion implantation process and the upper surface of the substrate;
   wherein a step of forming the contact region comprises:
   forming the contact region extending from the upper surface to the inside of the substrate through self-aligned implantation in a second ion implantation process by using the first barrier layer as a mask; and
   wherein a width of the contact region is smaller than a width of the base region;
   wherein a step of forming the source region comprises:
   at least etching part of a thickness of the first barrier layer in a lateral direction;
   forming a second barrier layer between the etched first barrier layer; and
   forming the source region extending from the upper surface to the inside of the substrate through self-aligned implantation in a third ion implantation process by using the etched first barrier layer and the second barrier layer as a mask,
   wherein, a thickness of the etched first barrier layer is smaller than a width of the base region extending below the first barrier layer.

2. The manufacturing method according to claim 1, wherein a material of the first barrier layer is different from a material of the second barrier layer.

3. The manufacturing method according to claim 1, wherein the thickness of the etched first barrier layer ranges from 800 to 1200 angstroms.

4. The manufacturing method according to claim 1, wherein the first barrier layer is etched by an isotropic etching process.

5. The manufacturing method according to claim 1, wherein removing the etched first barrier layer and the second barrier layer after forming the source region.

\* \* \* \* \*